(12) United States Patent
Daalmans

(10) Patent No.: US 7,495,624 B2
(45) Date of Patent: Feb. 24, 2009

(54) APPARATUS FOR DETECTION OF THE GRADIENT OF A MAGNETIC FIELD, AND A METHOD FOR PRODUCTION OF THE APPARATUS

(75) Inventor: Gabriel Daalmans, Hochstadt (DE)

(73) Assignee: Siemens Aktiengesellschaft, Munich (DE)

( * ) Notice: Subject to any disclaimer, the term of this patent is extended or adjusted under 35 U.S.C. 154(b) by 658 days.

(21) Appl. No.: 11/222,112

(22) Filed: Sep. 9, 2005

(65) Prior Publication Data

US 2006/0055614 A1 Mar. 16, 2006

(30) Foreign Application Priority Data

Sep. 9, 2004 (DE) .................. 10 2004 043 737

(51) Int. Cl.
*H01Q 1/00* (2006.01)
*H01Q 1/38* (2006.01)

(52) U.S. Cl. ................. 343/787; 343/700 MS; 343/850; 343/853; 343/893

(58) Field of Classification Search .............. 343/787
See application file for complete search history.

(56) References Cited

U.S. PATENT DOCUMENTS 5,982,176 A 11/1999 Kawamura et al.
6,465,053 B1 10/2002 Lenssen et al.
6,957,088 B2 * 10/2005 Kato et al. ............. 455/566
7,053,607 B2 * 5/2006 Sato ....................... 324/224
7,205,869 B2 * 4/2007 Bailleul et al. ......... 333/219.2
7,372,260 B2 * 5/2008 Sato ....................... 324/252
2005/0116869 A1* 6/2005 Siegler et al. ............. 343/749

FOREIGN PATENT DOCUMENTS

| DE | 43 27 796 A1 | 2/1995 |
| DE | 197 22 834 A1 | 12/1998 |
| DE | 100 41 797 C2 | 5/2001 |
| DE | 100 24 850 C2 | 11/2001 |
| EP | 0 573 372 B1 | 12/1993 |

\* cited by examiner

*Primary Examiner*—Trinh V Dinh
(74) *Attorney, Agent, or Firm*—Young & Thompson

(57) ABSTRACT

An apparatus for detection of the gradient of a magnetic field includes at least four antenna elements (11, 12, 13, 14) composed of a ferromagnetic material, which are arranged in pairs, and a bridge circuit having at least four resistance elements (1, 2, 3, 4), which are associated with the antenna elements (11, 12, 13, 14) or antenna element pairs. Each antenna element pair has at least one associated resistance element (1, 2, 3, 4) whose resistance value is dependent on the field strength and on the direction of the magnetic field, and which resistance element (1, 2, 3, 4) is arranged in a field area (19) which extends between the two antenna elements (11, 12, 13, 14) of the antenna element pair. The invention also relates to a method for production of an apparatus which is intended for detection of the gradient of a magnetic field.

22 Claims, 4 Drawing Sheets

APPARATUS FOR DETECTION OF THE GRADIENT OF A MAGNETIC FIELD, AND A METHOD FOR PRODUCTION OF THE APPARATUS

FIELD OF THE INVENTION

The invention relates to an apparatus for detection of the gradient of a magnetic field as claimed in patent claim 1. The invention also relates to a method for production of an apparatus, which is intended for detection of the gradient of a magnetic field, as claimed in the independent patent claims 20 and 32.

BACKGROUND OF THE INVENTION

Apparatuses with appropriately high resolution are required for detection of magnetic fields with a low field strength. Conventional apparatuses admittedly achieve the necessary resolution, but problems occur as soon as there are interfering electromagnetic fields in the vicinity.

The required resolution is admittedly achieved by the use of SQUID sensors (SQUID=Superconduction Quantum Interference Device), but problems occur in the event of interference caused by electromagnetic fields in the vicinity. Furthermore, the SQUID sensors have antenna elements composed of superconducting material. These require cooling, which increases the design complexity.

The use of a spin magnetometer likewise provides the required resolution, but a supporting magnetic field with a relatively high field strength is required. Furthermore, the supporting field must be very stable over time. The spin magnetometer has numerous components, so that the design complexity is relatively high. Furthermore, a spin magnetometer cannot be designed as an integrated circuit.

Finally, apparatuses with magnetoresistive sensors (XMR sensors) are known, whose resistance value depends on the field strength of the magnetic field. XMR sensors likewise achieve, strength of the magnetic field. XMR sensors likewise achieve, for example, the required resolution, but are susceptible to interference from electromagnetic fields in the vicinity. Shielding devices would considerably increase the design complexity.

SUMMARY OF THE INVENTION

One object of the invention is to provide an apparatus for detection of the gradient of a magnetic field which produces reliable results when the magnetic fields to be detected are small and interfering electromagnetic fields are present in the vicinity. A further object of the invention is to specify a method for production of an apparatus such as this.

With regard to the apparatus, this object is achieved by the subject matter as claimed in patent claim 1.

The apparatus according to the invention for detection of the gradient of a magnetic field has at least four antenna elements composed of a ferromagnetic material, which are arranged in pairs, and a bridge circuit having at least four resistance elements, which are associated with the antenna elements or antenna element pairs. In this case, each antenna element pair has at least one associated resistance element, whose resistance value is dependent on the field strength and of the direction of the magnetic field. Furthermore, the resistance element is arranged in a field area which extends between the two antenna elements of the antenna element pair.

The antenna elements focus the magnetic flux in the field areas between the two antenna elements of an antenna element pair. The resistance value of the resistance elements depends on the field strength in the respective field areas. The bridge circuit produces an electrical voltage which depends on the field strengths in at least two field areas.

Furthermore, it is possible to provide for each antenna element pair to have at least one associated resistance element, whose resistance value is dependent on the angle between the direction of the field strength of the magnetic field and the direction of the electric current through the resistance element. Resistance elements such as these are known, in particular, as AMR sensors. The field strengths of specific components of the magnetic field can be detected by specific alignment of the resistance elements.

In a further embodiment of the resistance element, it is possible to provide for the resistance value of this resistance element to be a minimum in a predetermined direction of the field strength of the magnetic field. Resistance elements such as these are known, for example, as GMR sensors.

In another embodiment of the resistance element, it is possible to provide for the resistance value of this resistance element to be a minimum in a predetermined direction of the field strength of the magnetic field, and to be a maximum in a direction of the field strength of the magnetic field which is opposite the predetermined direction. TMR sensors are particularly suitable for this purpose.

Adjacent antenna element pairs are preferably at such a distance from one another that the antenna element pairs are essentially magnetically decoupled from one another. This means that the antenna element pair is arranged outside the area in which the magnetic field to be measured is significantly influenced and changed by the adjacent antenna element pair. This ensures that only the field to be measured is focused by the antenna element pair.

In the preferred embodiment, the antenna elements are produced from a soft-magnetic material. The relative permeability of the antenna elements is, for example, between 100 and 1200, preferably between 500 and 1000. This allows intensive focusing of the magnetic field to be detected. This results in an increase in the flux density, which also makes it possible to detect very small magnetic fields.

With regard to the geometric characteristics, it is possible to provide for the antenna elements to be in the form of elongated flat pieces. This results, in particular, in focusing of those components of the magnetic field which extend parallel to the longitudinal direction of the flat pieces.

Provision is advantageously made for the antenna elements to be in the form of rectangular flat pieces. In this case, the two antenna elements of the antenna element pair are arranged one behind the other along their longitudinal axes.

With regard to the geometric ratios, it is possible to provide for the ratio between the length of the antenna element pair on the one hand and the distance between the two antenna elements of the antenna element pair on the other hand to be between 10 and 200, preferably between 20 and 50. This makes it possible to achieve the desired increase in the flux density.

For example, in the case of the antenna elements, the ratio of the length and layer thickness is between 100:1 and 1000:1.

The resistance elements are preferably also in the form of flat pieces. This makes it easy to produce the apparatus, since the resistance elements can be produced, for example, by coating.

In order to allow a compact design, the antenna elements and/or the resistance elements may be arranged on a substrate. The entire apparatus may thus be in the form of an integrated component.

For example, the antenna elements and the resistance elements are arranged on one side of the substrate. This allows the antenna elements and resistance elements to be formed by common method steps, thus simplifying production.

In an alternative embodiment, it is possible to provide for the substrate to be in the form of a flat piece, and for the antenna elements and resistance elements to be arranged on opposite large-area sides of the substrate. This simplifies production, particularly when the antenna elements and resistance elements are formed differently.

From the material point of view, the invention provides for the substrate to be produced from sapphire or a similar material. Sapphire is a transparent material, and this is particularly advantageous when the resistance elements and the antenna elements are arranged on opposite sides of the substrate. In this case, the resistance elements and the antenna elements can be positioned particularly accurately on the substrate. Furthermore, sapphire has relatively high thermal conductivity, so that temperature differences within the apparatus can be equalized very quickly. Otherwise, the temperature differences could lead to drift voltages, which adversely affect the measurement accuracy, particularly in the low-frequency range.

Provision is preferably made for the antenna elements and/or the resistance elements to have at least one layer composed of permalloy. This is an alloy composed of nickel and iron which is composed, for example, of 80% nickel and 20% iron. Permalloy has the characteristics that its resistance varies by several percent when a magnetic field passes through it.

It is also possible to provide for the resistance element to have at least one barber's pole. The barber's pole is an electrically conductive strip which defines the major direction of the electric current through the resistance element. This linearizes the output voltage from the apparatus when the field strength is approximately zero.

With regard to the arrangement of the resistance elements, it is possible to provide for the resistance elements to be aligned in such a way that the direction of the components of the magnetic field to be determined is arranged at right angles to the direction of the electric current through the resistance element. In this constellation the resistance value of numerous resistance elements is particularly sensitive to the magnetic field.

Furthermore, the bridge circuit may have at least two input terminals, which are intended for application of a supply voltage. When a constant voltage is applied, even minor changes in the resistance values of the resistance elements can be detected. This contributes to the measurement accuracy of the overall apparatus.

Finally, the bridge circuit has at least two output terminals. The voltage which is produced at the output terminals is a function of the ratios of the resistance values, and thus of the field strength at two different points.

With regard to the method, the object is achieved by the subject matter as claimed in patent claim 23.

The method according to the invention for production of an apparatus which is intended for detection of the gradient of a magnetic field comprises the following steps:
a) provision of a substrate;
b) application of a basic layer to at least one side of the substrate;
c) structuring of resistance flat elements and antenna flat elements in the basic layer;
d) provision of the resistance flat elements with barbers' poles and connecting terminals;
e) connection of the resistance flat elements to form a bridge circuit; and
f) formation of at least one further layer on the antenna flat elements.

In the method according to the invention, both the resistance flat elements and the antenna flat elements are formed jointly in one step on a substrate. The resistance flat elements are then connected to one another and at least one further layer is formed on the antenna flat elements, in order to provide the antenna elements with the required thickness.

The basic layer is advantageously applied by sputtering. During the sputtering process, a suitable composition of the material can be applied over a large area with a particularly high density, which in turn allows high relative permeability. By way of example, values of about 1000 are possible for the relative permeability.

One embodiment of the method provides for the formation of the at least one further layer based on step f) to be carried out by the following steps:
  creation of a mask which covers in particular the bridge circuit; and
  application of the at least one further layer.

This procedure allows the antenna elements to be positioned particularly accurately with respect to the resistance elements.

The at least one further layer is also preferably applied by sputtering. In this case, the sputtering of the further layer is carried out by successive application of a plurality of layers. The successive application of several layers is to allow a high density and thus high relative permeability as well.

Alternatively, the at least one further layer can be applied electrochemically. This is a particularly cost-effective and rapid method. The density of the antenna layer can then be increased, for example by heat treatment. Electrochemical application allows a layer thickness of about 10 μm. Electrochemical application results in a relative permeability of about 500.

In another embodiment, the at least one further layer is formed according to step f) by the following steps:
  provision of a further flexible substrate;
  application of the at least one further layer to the flexible substrate; and
  alignment and fixing of the flexible substrate on the antenna flat elements.

This procedure has the advantage that the resistance element flat pieces which have already been applied to the substrate are not subsequently changed in an undesirable manner.

For this purpose, by way of example, it is possible to provide for the at least one further layer to be adhesively bonded as a soft-magnetic sheet onto the flexible substrate. As an alternative to this, the at least one further layer can be applied to the flexible substrate by sputtering, and can then be etched. A transparent Capton sheet may be used as the flexible substrate.

Finally, the at least one further layer can also be formed according to step f) by carrying out the following steps:
  adhesive bonding of a soft-magnetic sheet onto the basic layer;
  fitting of an etching mask to the soft-magnetic sheet; and
  formation of antenna elements by etching.

This results in the antenna elements being positioned particularly accurately with respect to the resistance elements.

In order to increase the accuracy of the arrangement, it is possible to provide for the soft-magnetic sheet to have holes or the like for positioning on the basic layer.

The object is also achieved by an alternative method as claimed in patent claim 35.

The alternative method for production of an apparatus which is intended for detection of the gradient of a magnetic field has the following steps:
a) provision of a substrate which is in the form of a flat piece;
b) application of a resistance layer to a first large-area side of the substrate;
c) application of an antenna layer to a second large-area side of the substrate;
d) structuring of resistance flat elements in the resistance layer;
e) structuring of antenna elements in the antenna layer;
f) provision of the resistance flat elements with barbers' poles and connecting terminals; and
g) connection of the resistance flat elements to form a bridge circuit.

The alternative method is distinguished in particular by the antenna elements on the one hand and the bridge circuit on the other hand being arranged on opposite sides of the substrate. A thin flat piece is required as the substrate for this purpose, in order that the distance between the antenna elements and the resistance elements does not become too great.

The methods according to the invention are intended in particular for production of the apparatus as described above.

Further features, advantages and particular embodiments of the invention are the subject matter of the dependent claims.

BRIEF DESCRIPTION OF THE DRAWINGS

The apparatus and the method according to the invention will be explained in more detail, in the description in the figures, on the basis of exemplary embodiments and with reference to the attached drawings, in which.

DETAILED DESCRIPTION OF THE INVENTION

Figure 1:
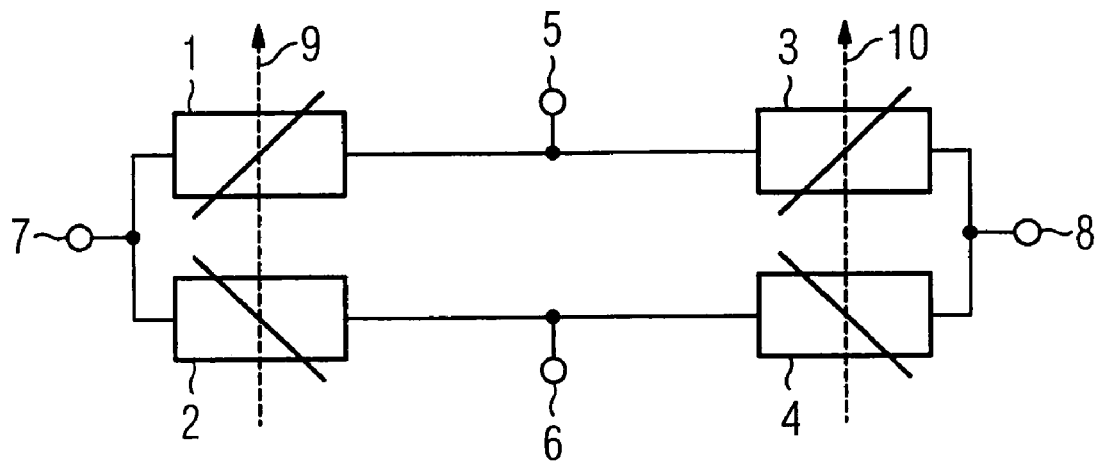
FIG. 1 shows a schematic illustration of a bridge circuit for a first embodiment of the apparatus according to the invention.

FIG. 1 illustrates, schematically, a bridge circuit for a first embodiment of the apparatus according to the invention. This exemplary embodiment is intended for AMR sensors. The bridge circuit has a first resistance element 1, a second resistance element 2, a third resistance element 3 and a fourth resistance element 4. The first resistance element 1 and the second resistance element 2 are connected in series. The third resistance element 3 and the fourth resistance element 4 are likewise connected in series. The two rows are in turn connected in parallel.

The bridge circuit has a first input terminal 5 between the first resistance element 1 and the third resistance element 3. The bridge circuit has a second input terminal 6 between the second resistance element 2 and the fourth resistance element 4. The input terminals 5 and 6 are intended for the application of a supply voltage. A first output terminal 7 is located between the first resistance element 1 and the second resistance element 2. A second output terminal 8 is located between the third resistance element 3 and the fourth resistance element 4. The voltage which is produced at the output terminals 7 and 8 depends in particular on the resistance values of the resistance elements 1, 2, 3 and 4.

The resistance values of the four resistance elements 1, 2, 3 and 4 depend on the magnetic field to be detected. The four resistance elements 1, 2, 3 and 4 are aligned with their longitudinal directions parallel to one another. The resistance values of the resistance elements 1, 2, 3 and 4 depend essentially on the field strength of that component of the magnetic field which extends at right angles to the longitudinal direction of the resistance elements 1, 2, 3 and 4. The resistance elements 1, 2, 3 and 4 are magnetically polarized in their longitudinal direction. The component of the magnetic field which is detected by the apparatus at a first point is represented by an arrow 9, and that at a second point is represented by an arrow 10. In this case, the length of the arrows 9 and 10 corresponds to the magnitudes of the field strength, and the arrow direction corresponds to the field direction. The resistance elements 1, 2, 3 and 4 are aligned spatially such that the components of the magnetic field to be detected can be detected at the two different points 9 and 10.

The resistance values of the first and second resistance elements 1 and 2 are changed in opposite senses. If the component of the magnetic field at the first point 9 is increased, then the resistance value of the first resistance element 1 increases, and that of the second resistance element 2 decreases. The third and fourth resistance elements 3 and 4 also behave in opposite senses. When the component of the magnetic field at the second point 10 increases, the resistance value of the third resistance element 3 increases, and that of the fourth resistance element 4 decreases. This on the one hand results in suppression of a homogeneous field at the output terminals, while on the other hand achieving the maximum possible change in the voltage between the output terminals 7 and 8 for a predetermined field gradient between the points 9 and 10. This contributes considerably to the accuracy of the overall apparatus.

Figure 2:
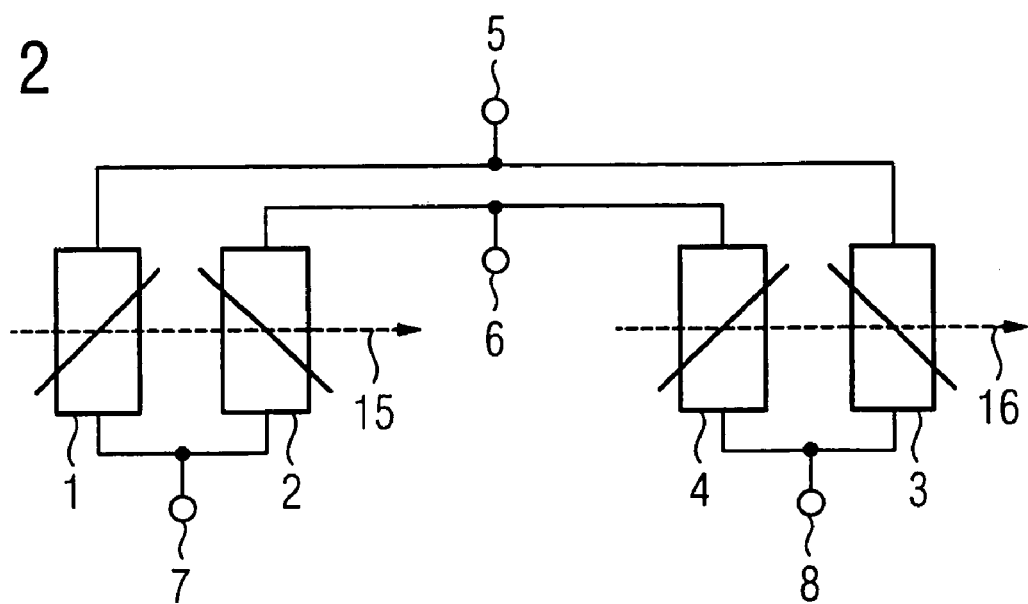
FIG. 2 shows a schematic illustration of a bridge circuit for a second embodiment of the apparatus according to the invention.

FIG. 2 shows, schematically, a bridge circuit for a second embodiment of the apparatus according to the invention. As in FIG. 1, the bridge circuit shown in FIG. 2 has a first resistance element 1, a second resistance element 2, a third resistance element 3 and a fourth resistance element 4. This bridge circuit likewise has a first input terminal 5 and a second input terminal 6, as well as a first output terminal 7 and a second output terminal 8. The bridge circuit shown in FIG. 2 with regard to the electrical connection, is identical to the bridge circuit shown in FIG. 1. The bridge circuits in FIG. 1 and FIG. 2 differ only in the geometrical arrangement of the resistance elements 1, 2, 3 and 4.

The resistance elements 1, 2, 3 and 4 in FIG. 2 are aligned with their longitudinal directions parallel to one another. The resistance values of the resistance elements 1, 2, 3 and 4 in FIG. 2 also depend on the field strength of that component of the magnetic field which extends at right angles to the electrical current direction in the resistance elements. The component of the magnetic field which is detected by the apparatus at a first and a second point is represented by the arrows 15 and 16, respectively. The resistance elements 1, 2, 3 and 4 are spatially aligned such that the same component of the magnetic field is detected at the first point 15 and at the second point 16.

In FIG. 2 as well, the resistance values of the first and second resistance elements 1 and 2 change in opposite senses.

If the component of the magnetic field at the first point 15 is increased, then the resistance value of the first resistance element 1 decreases and that of the second resistance element 2 increases. The third and fourth resistance elements 3 and 4 also behave in opposite senses. When the component of the magnetic field of the second point 16 increases, the resistance value of the third resistance element 3 increases, and that of the fourth resistance element 4 decreases. This on the one hand suppresses the effect of the homogeneous field and on the other hand results in the maximum possible change in the voltage between the output terminals 7 and 8 for a predetermined field gradient between the points 15 and 16, thus contributing to the accuracy of the overall apparatus.

Figure 3:
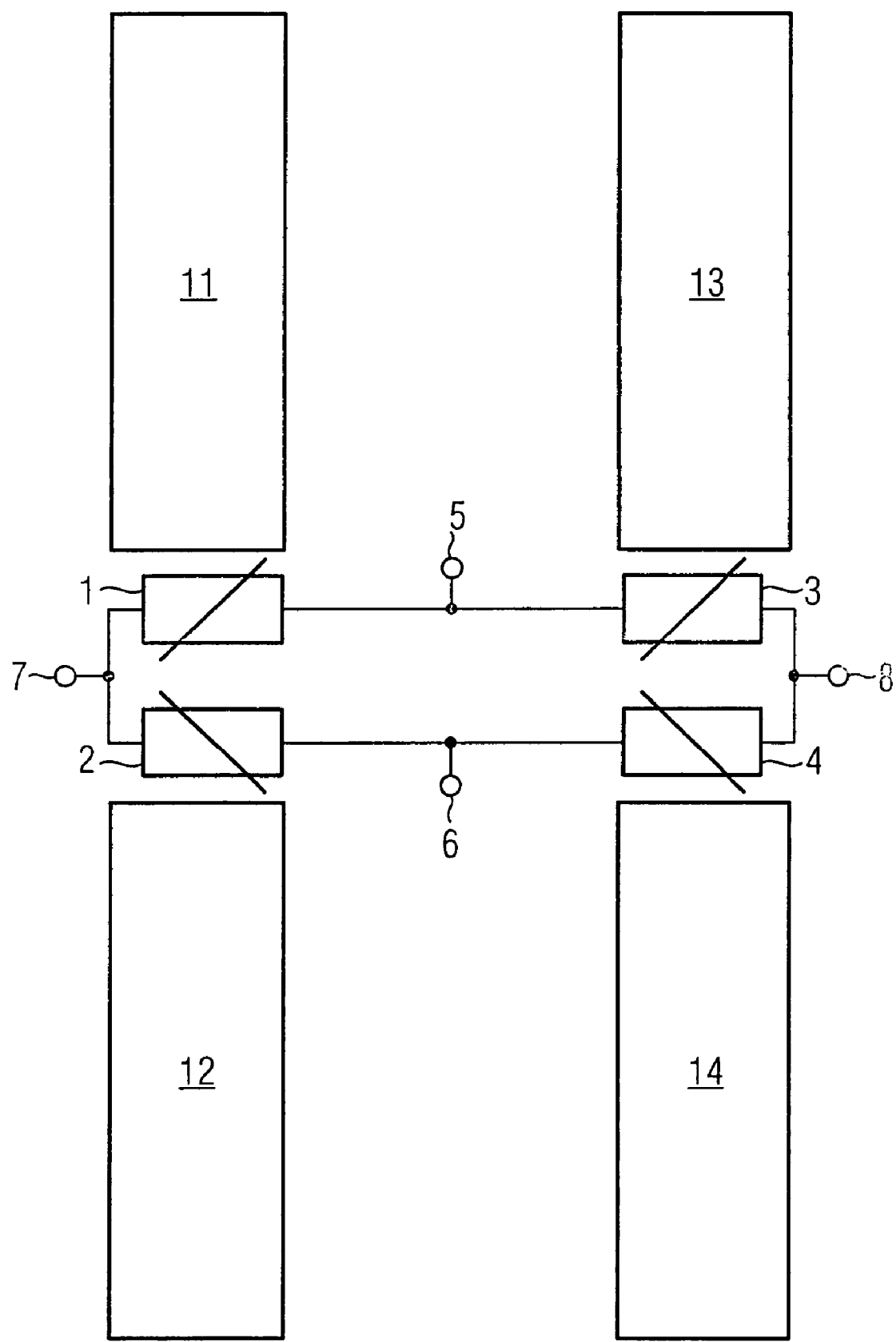
FIG. 3 shows a schematic illustration of the first embodiment of the apparatus according to the invention.

FIG. 3 shows a schematic illustration of the first embodiment of the apparatus according to the invention. This exemplary embodiment is illustrated for AMR sensors. The first embodiment comprises the bridge circuit as shown in FIG. 1 as well as four antenna elements 11, 12, 13 and 14. The resistance elements 1, 2, 3 and 4 are associated with the respective antenna elements 11, 12, 13 and 14. The antenna elements 11, 12, 13 and 14 are in the form of rectangular flat pieces. The antenna elements 11 and 12 as well as the antenna elements 13 and 14 are each arranged in pairs. Furthermore, the two antenna elements 11 and 12 as well as 13 and 14 of one antenna element pair are each arranged one behind the other along their longitudinal axes. The resistance elements 1 and 2 are arranged between the antenna elements 11 and 12. The resistance elements 3 and 4 are arranged between the antenna elements 13 and 14.

The antenna elements 11, 12, 13 and 14 preferably have a length between 1000 µm and 10 000 µm. The layer thickness of the antenna elements 11, 12, 13 and 14 is preferably between 1 µm and 10 µm. The distance between the two antenna elements 11 and 12 as well as 13 and 14 within one antenna element pair is preferably between 100 µm and 500 µm.

The antenna elements 11, 12, 13 and 14 result in the magnetic flux being focused. Since the antenna elements 11, 12, 13 and 14 are relatively broad, the focusing corresponds approximately to the ratio between the length of the antenna elements 11, 12, 13 and 14 and the distance between two antenna elements 11 and 12 as well as 13 and 14, in one antenna element pair. The distance between the two antenna element pairs is chosen to be sufficiently great that the antenna element pairs are magnetically decoupled from one another. By way of example, the distance between the two antenna element pairs is approximately of the same magnitude as the overall length of one antenna element pair.

The apparatus shown in FIG. 3 is intended to detect that component, for example $H_y$, of the magnetic field which extends parallel to the longitudinal direction of the resistance elements. In this case, this component $H_y$ is detected at a first point $x_1$ between the two resistance elements 11 and 12, and at a second point $x_2$ between the resistance elements 13 and 14. The difference $H_y(x_1)-H_y(x_2)$ corresponds to the gradient $\partial H_y/\partial x$ in the area between $x_1$ and $x_2$. The voltage between the output terminals 7 and 8 depends on this gradient.

Figure 4:
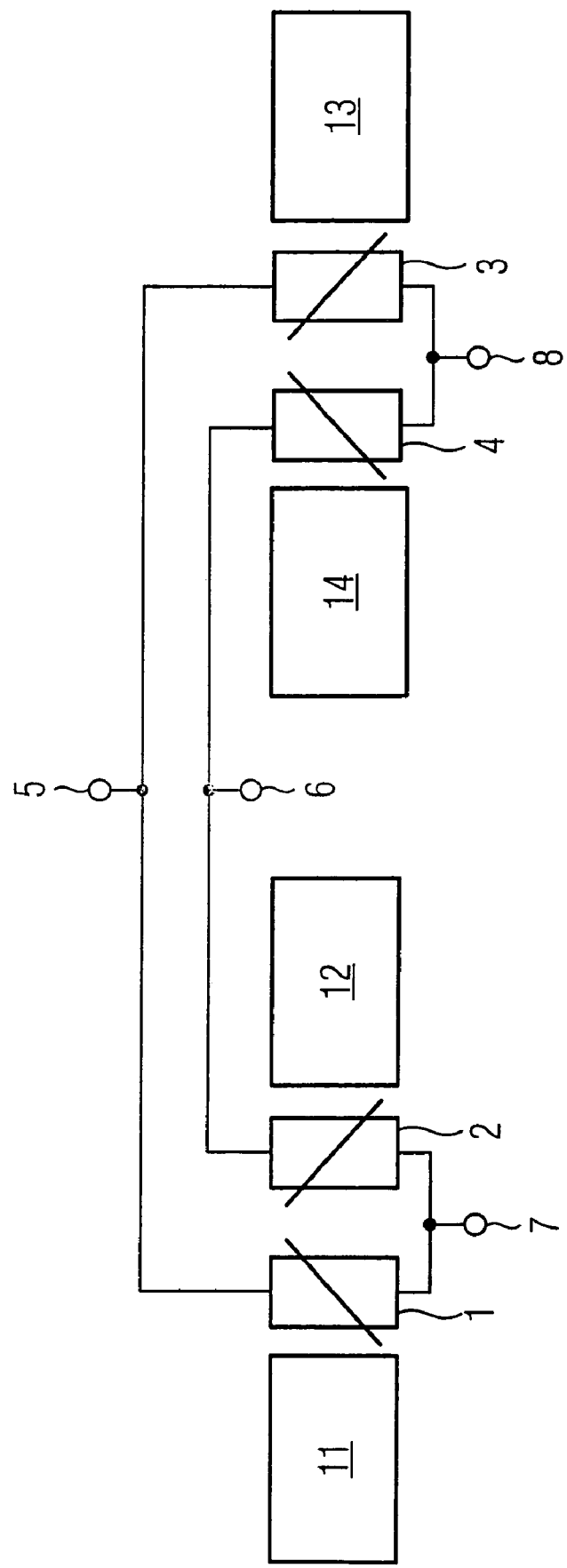
FIG. 4 shows a schematic illustration of the second embodiment of the apparatus according to the invention.

FIG. 4 shows a schematic illustration of the second embodiment of the apparatus according to the invention. The second embodiment comprises the bridge circuit as shown in FIG. 2 as well as the four antenna elements 11, 12, 13 and 14. The resistance elements 1, 2, 3 and 4 are associated with the respective antenna elements 11, 12, 13 and 14. The antenna elements 11, 12, 13 and 14 are in the form of rectangular flat pieces. The antenna elements 11 and 12 as well as the antenna elements 13 and 14 are each arranged in pairs. Furthermore, all four antenna elements 11, 12, 13 and 14 are arranged one behind the other along their longitudinal axes. In this case, the distance between the antenna elements 11 and 12 as well as 13 and 14 of one antenna element pair is relatively short, specifically between 100 µm and 500 µm. In contrast, the distance between the two antenna element pairs corresponds approximately to the length of the antenna element pair. The two antenna element pairs are thus magnetically decoupled from one another.

The apparatus illustrated in FIG. 4 is intended to detect that component, for example $H_z$, of the magnetic field which extends parallel to the longitudinal direction of the resistance elements. In this case, this component $H_z$ is detected at a first point $z_1$ between the two resistance elements 11 and 12, and at a second point $z_2$ between the resistance elements 13 and 14. The difference $H_z(z_1)-H_z(z_2)$ corresponds to the gradient $\partial H_z/\partial z$ in the area between $z_1$ and $z_2$. The voltage between the output terminals 7 and 8 is a function of this gradient.

Figure 5:
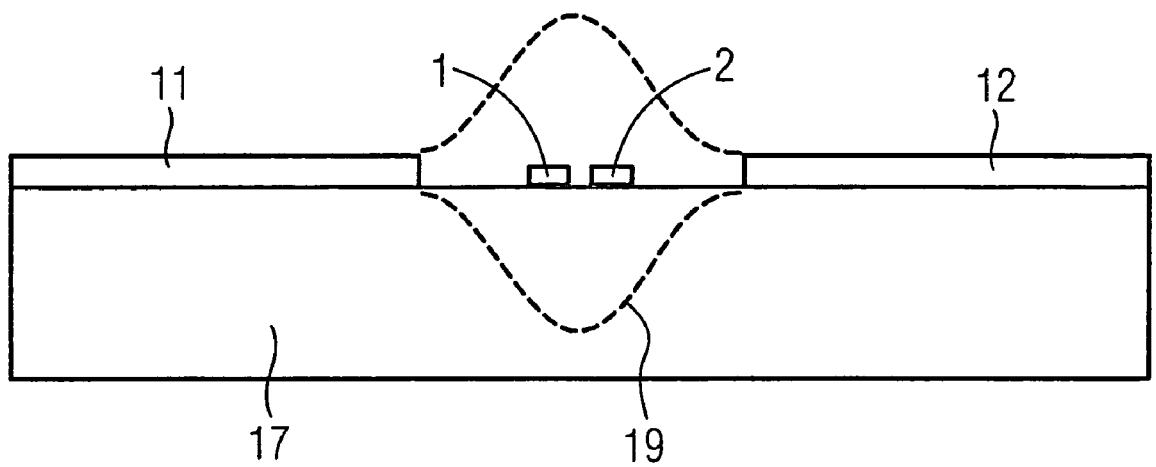
FIG. 5 shows a section view of a first arrangement of the apparatus according to the invention on a substrate.

FIG. 5 shows a section view of a first arrangement of the apparatus according to the invention on a substrate 17. In this case, the resistance elements 1 and 2 as well as the antenna elements 11 and 12 are arranged on one side of the substrate 17. A field area 19 is represented by dashed lines. The magnetic flux of the magnetic field to be detected is focused in the field area 19. The resistance elements 1 and 2 are located at the center of the field area 19. This ensures that the field to be detected is increased optimally.

Figure 6:
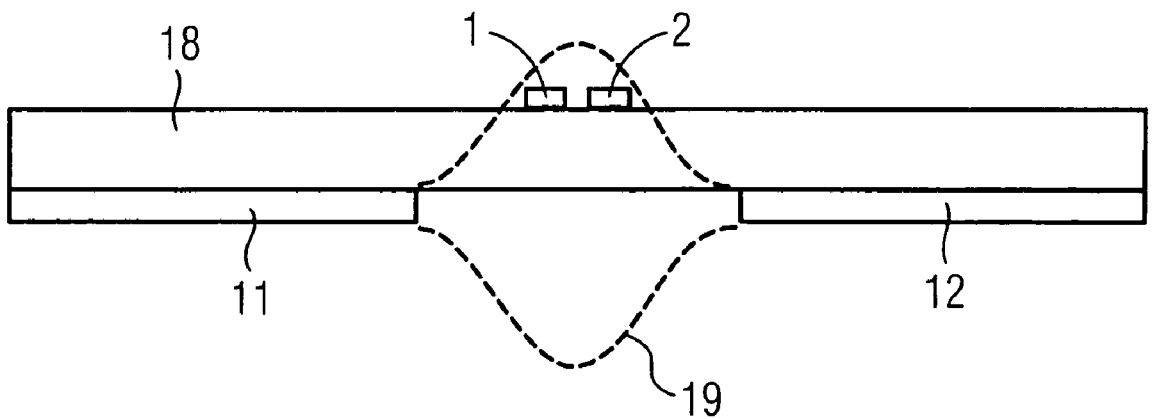
FIG. 6 shows a section view of a second arrangement of the apparatus according to the invention on the substrate.

FIG. 6 shows a section view of a second arrangement of the apparatus according to the invention on a substrate 18. The substrate 18 is in the form of a flat piece, at least in places. In this case, the resistance elements 1 and 2 are arranged on one large-area side of the substrate 18, and the antenna elements 11 and 12 are arranged on the other large-area side of the substrate 18. The field area 19 is represented by dashed lines. The magnetic flux of the magnetic field to be detected is focused in the field area 19. The thickness of the substrate 18 is chosen such that the resistance elements 1 and 2 are located within the field area 19. The substrate 18 is preferably produced from sapphire or from some other transparent material. This has the advantage that the resistance elements 1 and 2 and the antenna elements 11 and 12 are positioned particularly accurately.

The apparatus according to the invention allows the detection of the gradient of very small magnetic fields. The bridge circuit eliminates interfering homogeneous fields and temperature fluctuations. The design complexity is relatively low. Finally, the apparatus according to the invention also allows the detection of a second-order field gradient.

The invention claimed is:

1. An apparatus for detection of the gradient of a magnetic field, which has the following:
   a) at least four antenna elements (11, 12, 13, 14) composed of a ferromagnetic material, which are arranged in pairs; and
   b) a bridge circuit having at least four resistance elements (1, 2, 3, 4), which are associated with the antenna elements (11, 12, 13, 14) or antenna element pairs;
   c) with each antenna element pair having at least one associated resistance element (1, 2, 3, 4) whose resistance value is dependent on the field strength and on the direction of the magnetic field, and which resistance element (1, 2, 3, 4) is arranged in a field area (19) which extends between the two antenna elements (11, 12, 13, 14) of the antenna element pair.

2. The apparatus as claimed in claim 1, characterized in that each antenna element pair has at least one associated resistance element (1, 2, 3, 4) whose resistance value is dependent on the angle between the direction of the field strength of the magnetic field and the direction of the electric current through the resistance element (1, 2, 3, 4).

3. The apparatus as claimed in claim 1, characterized in that each antenna element pair has at least one associated resistance element (1, 2, 3, 4) whose resistance value is a minimum in a predetermined direction of the field strength of the magnetic field.

4. The apparatus as claimed in claim 1, characterized in that each antenna element pair has at least one associated resistance element (1, 2, 3, 4) whose resistance value is a minimum in a predetermined direction of the field strength of the magnetic field and is a maximum in the opposite direction of the field strength of the magnetic field to the predetermined direction.

5. The apparatus as claimed in claim 1, characterized in that adjacent antenna element pairs are at such a distance from one another that the antenna element pairs are essentially magnetically decoupled from one another.

6. The apparatus as claimed in claim 1, characterized in that the antenna elements (11, 12, 13, 14) are produced from a soft-magnetic material.

7. The apparatus as claimed in claim 1, characterized in that the antenna elements (11, 12, 13, 14) have a relative permeability between 100 and 1200, preferably between 500 and 1000.

8. The apparatus as claimed in claim 1, characterized in that the antenna elements (11, 12, 13, 14) are in the form of elongated flat pieces.

9. The apparatus as claimed in claim 8, characterized in that the two antenna elements (11, 12, 13, 14) in the antenna element pair are arranged one behind the other along their longitudinal axes.

10. The apparatus as claimed in claim 8, characterized in that the ratio of the length and layer thickness of the antenna elements (11, 12, 13, 14) is between 100:1 and 1000:1.

11. The apparatus as claimed in claim 1, characterized in that the antenna elements (11, 12, 13, 14) are in the form of rectangular flat pieces.

12. The apparatus as claimed in claim 1, characterized in that the ratio between the length of the antenna element pair on the one hand and the distance between the two antenna elements (11, 12, 13, 14) of the antenna element pair on the other hand is between 10 and 200, preferably between 20 and 50.

13. The apparatus as claimed in claim 1, characterized in that the resistance elements (1, 2, 3, 4) are in the form of flat pieces.

14. The apparatus as claimed in claim 1, characterized in that the antenna elements (11, 12, 13, 14) and/or the resistance elements (1, 2, 3, 4) are arranged on a substrate (17; 18).

15. The apparatus as claimed in claim 14, characterized in that the antenna elements (11, 12, 13, 14) and the resistance elements (1, 2, 3, 4) are arranged on one side of the substrate (17).

16. The apparatus as claimed in claim 14, characterized in that the substrate is in the form of a flat piece, and the antenna elements (11, 12, 13, 14) and the resistance elements (1, 2, 3, 4) are arranged on opposite large-area sides of the substrate (18).

17. The apparatus as claimed in claim 14, characterized in that the substrate (17; 18) is produced from sapphire or a similar material.

18. The apparatus as claimed in claim 1, characterized in that the antenna elements (11, 12, 13, 14) and/or the resistance elements (1, 2, 3, 4) have at least one layer composed of permalloy.

19. The apparatus as claimed in claim 1, characterized in that the resistance element (1, 2, 3, 4) has at least one barber's pole.

20. The apparatus as claimed in claim 1, characterized in that the resistance elements (1, 2, 3, 4) are aligned such that the direction of the component of the magnetic field to be determined is arranged at right angles to the direction of the electric current through the resistance element.

21. The apparatus as claimed in claim 1, characterized in that the bridge circuit has at least two input terminals (5, 6), which are provided for application of a supply voltage.

22. The apparatus as claimed in claim 1, characterized in that the bridge circuit has at least two output terminals (7, 8).

* * * * *